United States Patent
Chung (10) Patent No.: US 8,917,752 B2
(45) Date of Patent: Dec. 23, 2014

(54) REFLECTIVITY-MODULATED GRATING MIRROR

(75) Inventor: Ii-Sug Chung, Ballerup (DK)

(73) Assignee: Danmarks Tekniske Universitet, Lyngby (DK)

( * ) Notice: Subject to any disclaimer, the term of this patent is extended or adjusted under 35 U.S.C. 154(b) by 0 days.

(21) Appl. No.: 14/111,319

(22) PCT Filed: May 9, 2012

(86) PCT No.: PCT/DK2012/050157
§ 371 (c)(1),
(2), (4) Date: Mar. 24, 2014

(87) PCT Pub. No.: WO2012/155911
PCT Pub. Date: Nov. 22, 2012

(65) Prior Publication Data
US 2014/0219301 A1      Aug. 7, 2014

Related U.S. Application Data

(60) Provisional application No. 61/486,930, filed on May 17, 2011.

(30) Foreign Application Priority Data

May 17, 2011   (EP) ..................................... 11166358

(51) Int. Cl.
*H01S 5/00* (2006.01)
*H01S 5/183* (2006.01)

(52) U.S. Cl.
CPC .................................. *H01S 5/18302* (2013.01)
USPC ...................................................... 372/50.11

(58) Field of Classification Search
CPC ............................. H01S 5/18302; H01S 5/183
USPC .................... 372/28, 50.11, 50.124; 359/346
See application file for complete search history.

(56) References Cited

U.S. PATENT DOCUMENTS

| | | |
|---|---|---|
| 5,056,098 A | 10/1991 | Anthony et al. |
| 5,072,272 A | 12/1991 | Omura |

(Continued)

OTHER PUBLICATIONS

Chang et al., "Efficient, High-Data-Rate, Tapered Oxide-Aperture Vertical-Cavity Surface-Emitting Lasers," *IEEE Journal of Selected Topics in Quantum Electronics* vol. 15, No. 3 (2009); 704-715.
Hadley, "Effective index model for vertical-cavity surface-emitting lasers," *Optics Letters* vol. 20, No. 13 (1995); 1483-1485.
Li et al., "Strong Optical Confinement between Nonperiodic Flat Dielectric Gratings," *Physical Review Letters* 106 (2011); 193901-1-193901-4.

(Continued)

*Primary Examiner* — Tuan Nguyen
(74) *Attorney, Agent, or Firm* — Knobbe Martens Olson & Bear LLP (57) ABSTRACT

The invention relates to vertical cavity lasers (VCL) incorporating a reflectivity-modulated grating mirror (1) for modulating the laser output. A cavity is formed by a bottom mirror (4), an active region (3), and an outcoupling top grating mirror (1) formed by a periodic refractive index grating region in a layer structure comprising a p- and a n-doped semiconductor layer with an electrooptic material layer (12) arranged there between. The grating region comprises a grating structure formed by periodic perforations to change the refractive index periodically in directions normal to the oscillation axis. A modulated voltage (91) is applied in reverse bias between the n- and p-doped layers to modulate the refractive index of the electrooptic material layer (12) and thereby the reflectivity spectrum of the grating mirror (1). The reflectivity of the grating mirror (1) can be modulated between a reflectivity with little or no out coupling and a reflectivity with normal out coupling, wherein lasing in the VCL is supported at both the first and the second reflectivity. As the out coupling mirror modulates the output, the lasing does not need to be modulated, and the invention provides the advantage of lower power consumption at high modulation speeds.

14 Claims, 6 Drawing Sheets

(56) References Cited

U.S. PATENT DOCUMENTS

| | | | |
|---|---|---|---|
| 5,222,071 | A | 6/1993 | Pezeshki et al. |
| 5,408,486 | A | 4/1995 | Shoji |
| 6,826,223 | B1 * | 11/2004 | Meyer et al. .................... 372/96 |
| 7,593,436 | B2 | 9/2009 | Ledentsov et al. |
| 7,701,629 | B2 | 4/2010 | Wang et al. |
| 2007/0201526 | A1 | 8/2007 | Hori |
| 2007/0291808 | A1 | 12/2007 | Ledentsov et al. |
| 2008/0259981 | A1 | 10/2008 | Wang et al. |
| 2008/0298418 | A1 * | 12/2008 | Uchida .................... 372/50.124 |
| 2009/0196319 | A1 | 8/2009 | Hori et al. |

OTHER PUBLICATIONS

Ledentsov, "Long-Wavelength Quantum-Dot Lasers on GaAs Substrates: From Media to Device Concepts," *IEEE Journal of Selected Topics in Quantum Electronics* vol. 8, No. 5 (2002); 1015-1024.

Miller, "Device Requirements for Optical Interconnects to Silicon Chips," *Proceedings of the IEEE* vol. 97, No. 7 (2009); 1166-1185.

Schukin et al., "Ultrahigh-speed electrooptically-modulated VCSELs: modeling and experimental results," *Proc. of SPIE* vol. 6889 (2008); 68890H-1-68890H-15.

* cited by examiner

REFLECTIVITY-MODULATED GRATING MIRROR

CROSS REFERENCE TO RELATED APPLICATIONS

This application is a U.S. National Phase Application of PCT International Application Number PCT/DK2012/050157, filed on May 9, 2012, designating the United States of America and published in the English language, which is an International Application of and claims the benefit of priority to European Patent Application No. 11166358.9, filed on May 17, 2011, and U.S. Provisional Application No. 61/486,930, filed on May 17, 2011. The disclosures of the above-referenced applications are hereby expressly incorporated by reference in their entireties.

FIELD OF THE INVENTION

The present invention relates to a vertical cavity laser (VCL) incorporating a grating mirror of which the reflectivity can be modulated to modulate the laser output power.

BACKGROUND OF THE INVENTION

In short-distance optical interconnects applications, low energy consumption as well as high transmission speed of the building block devices is becoming the key technological issues as the data transmission bandwidth increases. Thus, the figure of merit is energy consumption per transmitted bit. According to a recent technology roadmap provided in D. A. B. Miller, "*Device requirements for optical interconnects to silicon chips*", *Proceedings of the IEEE*, vol. 97, p. 1166 (2009), a few 10 s fJ/bit is required in 2015-2020 for light transmitters of chip-level optical interconnects.

As light emitter, vertical-cavity surface-emitting lasers (VCSELs) are one of the preferable existing solutions. This is because their fabrication technology is matured and their energy consumption is much smaller than that of edge-emitting lasers due to their small active material volume. To send a bit signal, output light intensity of a light emitter should be modulated. There are two schemes for modulating the output light intensity; direct modulation and indirect (or external) modulation.

In the direct modulation scheme, the current injection to a laser is modulated. This leads to the intensity modulation of the output light. A state-of-the-art result is reported in Y.-C. Chang and L. A. Colden, "*Efficient, high-data-rate, tapered oxide-aperture vertical-cavity surface-emitting lasers*", *IEEE Journal of selected topics in quantum electronics*, vol. 15, p. 704, (2009). The transmission speed was 35 Gb/s, the energy consumption excluding the RF driver circuitry was 12.5 mW, and the emission wavelength was 980 nm. The demonstrated energy per bit of 357 fJ/bit (=12.5 mW/35 Gb/s) is remarkably small but is not sufficient for the aforementioned applications. The weakness of this approach is that it is difficult to further increase the speed or reduce the energy consumption: Speed of a laser diode is decided by its intrinsic response and circuit response. The intrinsic speed is defined by −3 dB bandwidth of the intrinsic frequency response which is proportional to relaxation oscillation frequency, $f_r$:

$$f_r \propto \sqrt{\frac{I - I_{th}}{V_p}} \quad (1)$$

where I is the injection current, $I_{th}$, threshold current, and $V_p$, modal volume. In order to obtain higher intrinsic speeds, the injection current needs to be higher while the modal volume, preferably smaller. In the demonstrated VCSEL, the modal volume is not likely to be further reduced since the oxide aperture diameter of 3 µm is very small. Regarding the injection current, if one increases the current for a higher intrinsic speed, it will result in higher energy consumption. On the other hand, if one decreases the current for smaller energy consumption, it will result in slower intrinsic speed. Thus, it is difficult to further increase the speed and decrease the energy consumption simultaneously in the conventional VCSEL structure. One should also consider that high injection current is detrimental to long-time stability of small-volume lasers. The speed related to the circuit response is mainly decided by the series resistance and capacitance of the laser structure. In the demonstrated VCSELs, these parasitic terms were already tightly suppressed. Thus, a significant improvement in speed related to parasitic circuit terms is not expected.

In the externally modulated scheme, constant-intensity light is generated in the laser part and the intensity modulation of this light occurs in an integrated modulator part. Since no modulation occurs in the laser part, current injection to the laser part can be small, resulting in small energy consumption of the laser part. Thus, if the energy consumption of the modulator part is small as well, the energy consumption of the whole structure including both the laser and modulator parts can be low.

A number of references disclose such an approach. For example, in U.S. Pat. No. 7,593,436 part of the light-exiting distributed Bragg reflector (DBR) includes an electrooptic material. Thus, the reflectivity spectrum of this light-exiting DBR can be modulated by modulating the reverse-biased voltage across the electrooptic material. This modulation of reflectivity spectrum leads to allowing and shutting the light emission, i.e., intensity modulation of the light output. A state-of-the-art result obtained by the inventors of the aforementioned invention is reported in V. A. Shchukin, et al., "*Ultrahigh-speed electrooptically-modulated VCSELs: Modelling and experimental results,*" *Proceeding of SPIE*, vol. 6889, 68890H, (2008). The energy per bit for the laser part was 40-80 fJ/bit at injection currents of 1-2 mA while that for the modulator part was about 100 fJ/bit. Here, the modulation speed was 40 Gbit/s and the lasing wavelength was about 960 nm. Thus, the overall energy per bit was 140-180 fJ/bit which is fairly lower than that of the direct modulation approach, but still needs further reduction to meet the required specification. In addition, another limitation that needs to be noted is that this approach of using a DBR which embeds an electrooptic material is not feasible for long wavelength VCSELs (wavelength 1310 nm): In order to obtain a sufficient contrast in reflectivity at a lasing wavelength of interest, the stopband widths of the passive DBR without an electrooptic material and the active DBR with an electrooptical material should be almost same. For long wavelength VCSELs, dielectric DBR or GaAs/AlGaAs DBR with large stopband widths can be used for passive DBRs. But, for active DBRs showing electrooptic effect, one needs to use InP-based material which has a much smaller stopband width than that of dielectric or GaAs/AlGaAs DBRs.

Hence, an improved way of modulating the laser output would be advantageous, and in particular a more efficient way of providing modulated laser outputs at very fast modulation rates and low energy consumption would be advantageous. In addition, a way that works both at short and long wavelengths is advantageous.

SUMMARY OF THE INVENTION

It is an object of the present invention to provide a vertical cavity laser (VCL) and a method for modulating the output of such a VCL that solve the above mentioned problems of the prior art with limitations on modulation speed and energy consumption.

Thus, the above described object and several other objects are intended to be obtained in a first aspect of the invention by providing a VCL with a reflectivity-modulated grating mirror comprising:

a cavity formed by a first and a second reflector formed in different layers on a substrate and an active region formed in the cavity, the cavity being arranged to support light oscillation along an oscillation axis normal to the substrate, wherein the first reflector is an outcoupling grating mirror formed by a refractive index grating region in a layer structure comprising a p-doped semiconductor layer and an n-doped semiconductor layer with an electrooptic material layer arranged there between, said grating region comprising a 1D or 2D grating structure formed by a plurality of perforations so that a refractive index changes periodically or nonperiodically in the grating region in directions normal to said oscillation axis; and electric contacts to apply bias to the electrooptic material layer and to the active region independently, wherein the p-doped semiconductor layer and the n-doped semiconductor layer of the grating mirror act as electric contacts for the electrooptic layer.

In a second aspect, the invention provides a method for modulating the light emission from a VCL by modulating the reflectivity spectrum of an outcoupling grating mirror of the VCL, the method comprising:

providing a VCL comprising an outcoupling grating mirror formed by a refractive index grating region in a layer structure comprising a p-doped semiconductor layer and an n-doped semiconductor layer with an electrooptic material layer arranged there between, the grating region comprising a 1D or 2D grating structure formed by a plurality of perforations so that a refractive index changes periodically or nonperiodically in said grating region in directions normal to an oscillation axis of the VCL;

initiating laser action in the VCL at a predetermined wavelength; and applying a modulated reverse-bias voltage between the n-doped semiconductor layer and the p-doped semiconductor layer to modulate the refractive index of the electrooptic material layer to modulate a reflectivity spectrum of the grating mirror between at least a first and a second reflectivity spectrum providing different first and second reflectivities at the predetermined wavelength, respectively, wherein lasing in the VCL is supported at both the first and the second reflectivity.

The invention has the following advantages over VCLs applying a reflectivity-modulated DBR such as US 2007/0291808 and U.S. Pat. No. 5,408,486:

The energy consumption related to the reflectivity modulation can be significantly reduced. It is because the voltage required to modulate the reflectivity of the grating mirror can be much smaller than that of the DBR and the energy consumption is proportional to the square of the voltage. This allows for the design of VCLs with ultralow energy consumption. Further details are discussed later in this section.

As discussed in the section 'Background of the invention', the reflectivity-modulated DBR is difficult to be implemented in wavelengths of 1310 and 1550 nm. The reflectivity-modulated grating mirror applied in the invention can be universally implemented at all wavelengths.

In the following, a number of further aspects, preferred and/or optional features, elements, examples and implementations will be described. Features or elements described in relation to one embodiment or aspect may be combined with or applied to the other embodiments or aspects where applicable. For example, structural and functional features applied in relation to the VCL may also be used as features in relation to the method for modulating the emission of a VCL by proper adaptation and vice versa. Also, explanations of underlying mechanisms of the invention as realized by the inventor are presented for explanatory purposes, and should not be used in ex post facto analysis for deducing the invention.

The perforations are holes extending through the entirety of the layer structure, and thereby through the p/n-doped semiconductor layers and the electrooptic layer between them. The perforations are preferably filled by air or any other electrically insulating medium with a refractive index substantially different from that of the layer structure. The perforations are formed so that a refractive index changes periodically or nonperiodically in the grating region in directions normal to said oscillation axis, in order to get transverse mode confinement in the laser. That also nonperiodic gratings may be used for this purpose is a understanding. In the present context, nonperiodic can be modulation of periodicity or truly non-periodic.

The basic structure of a VCL is the cavity between the two reflectors formed in layers on a substrate, and being arranged to support light oscillation along an oscillation axis normal to the substrate. Other laser types may be formed in layered structures without having vertical cavities, such as edge-emitting lasers. Such lasers are based on a very different design with an in-plane oscillation axis and thus represent a different technical field than the present invention. In preferred embodiments of the invention, the laser couples out radiation to the air or a waveguide through the top reflector, making the laser in these embodiments vertical-cavity surface-emitting laser (VCSEL, a special group of VCLs). Other types of laser may be surface emitting without being VCLs, e.g. if the outcoupling is based on emission of scattered light from the cavity. An example of a surface emitting laser formed in a layered structure that is not a VCL can be found in U.S. Pat. No. 6,826,223.

The wavelength-dependent reflectivity spectra of the reflectors and the optical gain of the active region are selected to support lasing in the VCL at a predetermined wavelength, also referred to as the laser wavelength, preferably between 650 nm-2000 nm, such as preferably around 850 nm, 980 nm, 1060 nm, 1310 nm, or 1550 nm.

Also, in preferred embodiments, the second reflector has a reflectivity of at least 99.9%, such as preferably 99.9%. The second reflector may be another grating mirror made in the Si layer of a SOI wafer, or a DBR, depending on applications and wavelengths.

An example of a prior art VCSEL using two dimensional (2D) grating mirrors can be found in e.g. US 2007/0201526. This structure differs from the present invention in several ways; one of them being that reflectivity of the grating mirrors cannot be modulated. None the less, the technology is similar and extensive references to VCSEL technology is made throughout the present description. The invention is thereby also advantageous as it applies matured VCSEL technologies exhibiting low power consumption, eminent single-mode property and good mode control in general. Further, the use of VCSEL technology allows for uncomplicated packaging.

The reflectivity-modulated grating mirror according to the invention functions as a reflector to establish the VCL cavity. The high reflectivity of grating mirrors is related to the resonant coupling between vertically incident free space modes and laterally-propagating modes of the grating. Vertically incident light is diffracted when it arrives at the grating, and due to sub-wavelength scale of the grating, all diffractions higher than the zero-th order occur in the direction of the grating plane. These are coupled to the grating modes. After some propagation in the grating, the grating modes are radiated back to the free space mode. This resonant coupling results in high reflectivity.

As previously indicated, the electrooptic material applied in the grating region is preferably QW or type-II heterojunction material. The modulation of the reflectivity of the grating mirror according to the invention is preferably based on the quantum confined Stark effect (QCSE). The reverse bias results in a strong external electrical field applied along the direction of the quantum confinement (here perpendicular to the layers) of the electrooptic material layer (quantum-confined system). The reverse bias setup means that virtually no current will flow through the electrooptic material. Changing the bias voltage results in a shift in both the wavelength and the intensity of the optical absorption peak due to the Stark effect, and thereby also in a shift in the refractive index (due to Kramers-Kronig relationship between the real and imaginary parts of the dielectric function of the medium).

The refractive index change of the grating mirror alters the resonance condition during the reflection process. The reflectivity spectrum is thereby also changed according to the grating mirror reflection mechanisms described above.

The relative shifts in absorption and refractive index are wavelength-dependent. According to the working principle of the present invention, the electrooptic material and the predetermined wavelength are preferably selected so that a reverse bias voltage modulation can be selected to modulate in particular the refractive index in the electrooptic material at the predetermined wavelength, while the absorption is kept substantially low.

In a preferred embodiment, the electrooptic material is QW semiconductor structures or type-II heterojunctions, with the semiconductor junctions designed or selected to provide the desired refractive index modulation and negligible absorption at the laser wavelength.

A QW structure can be formed in the layer structure by a thin semiconductor material layer (e.g. GaAs) sandwiched between two layers with a wider bandgap (e.g. AlAs). The QW structures may for example be grown by using a molecular beam epitaxy (MBE) or a metal organic chemical vapor deposition (MOCVD) equipment, and can be very thin, typically 6-10 nm thick. Electrons and holes are confined within the quantum well.

A type-II heterojunction formed in the layer structure comprises two different semiconductor materials. Heterojunction structures also can be grown by using a MBE or a MOCVD equipment. In the case of zero electric field, electrons and holes are separately and weakly confined on the opposite sides of the heterojunction.

It is an advantage of the reflectivity-modulated grating mirror that the layer over which the electric filed is applied, i.e. the thickness of undoped electrooptic material layers between the p/n-doped contact layers, can be made very thin. This means that the bias voltage, V needed to produce the necessary electric field strength for refractive index modulation, can be small. Since this grating mirror structure with an electrooptic material is a capacitor structure, the energy consumption for modulating the reflectivity, $P_{mod}$ is given by the following equation;

$$P_{mod} = \tfrac{1}{2} C V^2 \qquad (2)$$

Here, C is the capacitance of the grating mirror. In the thin grating mirror structure applied in the invention, the required voltage V can be as small as e.g. 0.2 V which is approximately 5 times smaller than the prior art employing the reflectivity-modulated DBR, e.g., US 2007/0291808 and U.S. Pat. No. 5,408,486. Also, the capacitance C can be e.g., 7 fF with a 7-μm-diameter doped region, which is approximately 2 times larger than the prior art, e.g., employing a DBR-based modulator with seven 3-QW pairs and a 7-μm-diameter doped region. Thus, the energy consumption for light modulation may be 10 times smaller than in the prior art. This allows for the design of VCLs with ultralow energy consumption.

The modulation of the voltage across the electrooptic material is preferably between at least the first and second voltages selected corresponding to the desired first and the second reflectivity values. The first voltage is preferably selected so that a reflectivity at the laser wavelength in the first reflectivity spectrum is a normal value for an outcoupling mirror in VCLs to provide a typical light emission intensity for the intended application while maintaining lasing, such as preferably a reflectivity in the interval of 99 to 99.5%. The second voltage is preferably selected so that a reflectivity at the laser wavelength in the second reflectivity spectrum turns off or reduces the emission significantly to provide a binary intensity modulation between the two emission levels, such as preferably a reflectivity of higher than 99.7%.

The laser action in the VCL is maintained and preferably kept unchanged during the modulation of the reflectivity spectrum of the grating mirror. Thus, the first and second reflectivity values need to be chosen sufficiently high so that the photon density in the laser cavity are kept sufficiently high to sustain lasing regardless of the reflectivity modulation. Otherwise, the modulation speed of emitted light intensity will be also influenced by the frequency response of the laser cavity. That is, it would fall into the direct modulation regime. As discussed in the section 'Background of the invention', the direct modulation speed of a VCSEL laser cavity is difficult to exceed 40 Gb/s. In principle, the speed response of the electrooptic grating mirror applied in the invention may exceed 100 GHz. Thus, 150 Gb/s would potentially be possible.

It is also preferred that the electrical bias to the active region the VCL is not modulated during the modulation of the voltage to the grating mirror.

In a further aspect, the invention provides optical interconnects comprising one or more VCLs according to the first aspect of the invention for generation of optical data signals based on received electric data signals. The optical interconnects may be implemented in on-chip level as well as the off-chip level. Such optical interconnects may solve most limitations of the current electrical interconnects such as energy consumption problem, crosstalk, speed limitation, channel density limitation, and high-speed clocking limitation. Compared to existing laser sources for chip-level optical interconnects, the laser sources according to the present invention involve the advantages of higher obtainable data rates and much lower energy consumption.

The basic idea of the invention is to make a grating mirror of which the reflectivity can be modulated, and to apply this reflectivity-modulated grating mirror to modulate the emission of a VCL. By modulating an electrical field of an electrooptic material in the grating mirror, the refractive index and ultimately the reflectivity of the grating mirror can be modulated very fast based on the QCSE. As only the electrical field is to be modulated with virtually no current flow, and as the layer over which it is applied can be made very thin, very low power consumption and high modulation speeds can be achieved.

These and other aspects of the invention will be apparent from the following description with reference to the described embodiments.

BRIEF DESCRIPTION OF THE FIGURES

Embodiments of the invention will now be described in more detail with regard to the accompanying figures. The figures show one way of implementing the present invention and is not to be construed as being limiting to other possible embodiments falling within the scope of the attached claim set.

DETAILED DESCRIPTION OF THE INVENTION

Figure 1A:
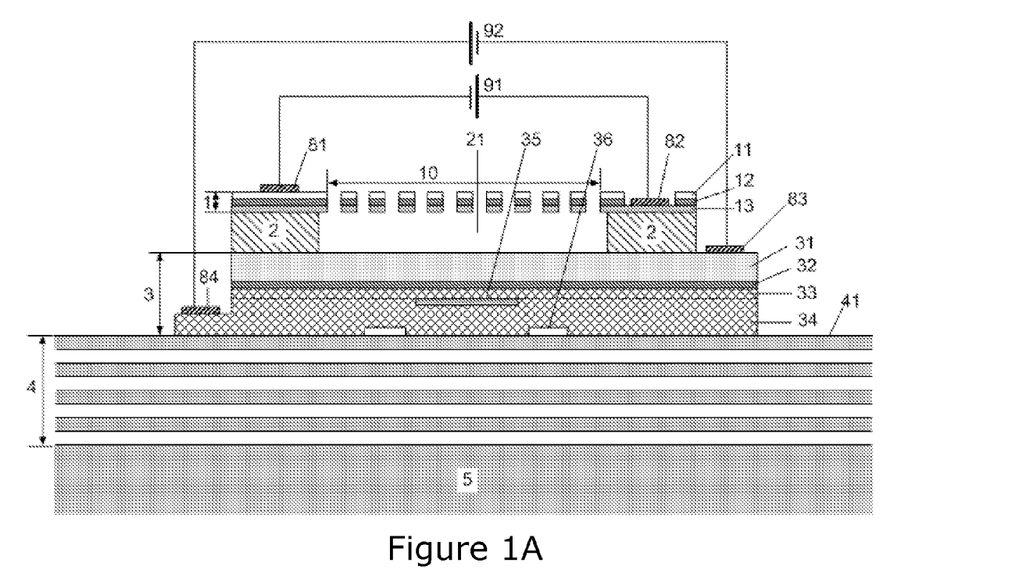
FIG. 1A is a schematic cross-sectional side-view of an example device of the invention. The cross-section is along the line AB designated in FIG. 1B.
Figure 1B:
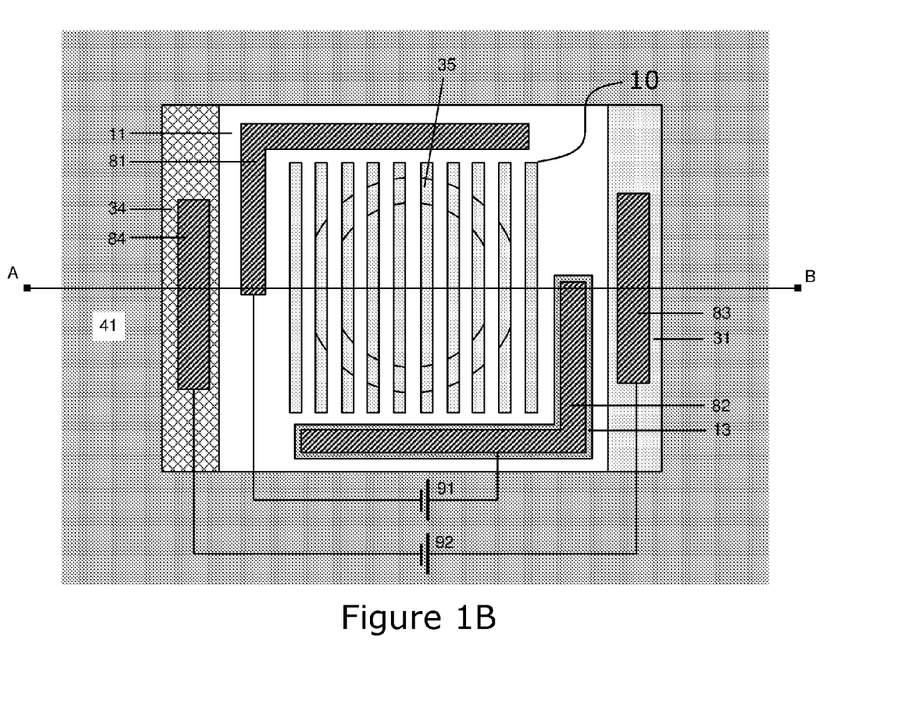
FIG. 1B is the top view of the device in FIG. 1A.

FIGS. 1A and 1B show cross-sectional side- and top views of an example of the invention, respectively. In this embodiment, the device consists of a grating mirror 1 having an embedded electrooptic material 12 and a grating structure 10, an air gap 21 (or sacrificial layer 2), an active region 3, and a DBR 4 all held by substrate 5. Light is generated in the active material 32 which is typically QWs, is vertically amplified between the grating mirror 1 and the DBR 4, and is emitted through the grating mirror 1. The forward bias 92 for light generation is applied between the p contact 84 and the n contact 83. The injected current flows through the n-doped layer 34, the tunnel junction 35, the p-doped layer 33, the active material 32, and the n-doped layer 31. The reflectivity of the grating mirror 1 is modulated to modulate light emission. The reverse bias 91 is applied between the p contact 81 and the n contact 82. Thus, a strong electric field is induced in the electrooptic material 12 between the p doped layer 11 and the n doped layer 13. Modulating the strength of the electric field by modulating the reverse bias voltage 91, results in the modulation of the refractive index of the electrooptic material 12, due to the QCSE. This refractive index modulation leads to the modulation of the reflectivity of the grating mirror 1 and that of light emission.

Injected currents for light generation are confined by the tunnel junction 35, and the optical mode confinement is obtained by the tunnel junction 35 as well as the low-refractive-index trench 36, preferably air trench. The optical mode confinement due to the tunnel junction 35 is a combination of several effects; the tunnel junction 35 can be designed to have a higher refractive index than the surrounding material. In addition, higher current density within the tunnel junction 35 further increases its refractive index and higher temperature around the tunnel junction 35 also increases the refractive index around it. The overall higher refractive index around the tunnel junction 35 provides optical confinement around the tunnel junction. The low-refractive-index trench 36 further strengthens the optical confinement. However, the tunnel junction 35 alone can provide the optical confinement so that in some device designs, the low-refractive-index trench 36 may be omitted.

Based on the descriptions and illustrations herein, detailed procedures of fabricating this device will be apparent to the people skilled in conventional VCSEL technology. The example device described in relation to FIG. 1 presumes wafer bonding of a passive DBR part and an active part. The passive DBR part includes the DBR 4, preferably undoped GaAs/AlGaAs DBR and the substrate 5, preferably GaAs substrate. The active part includes epitaxial layers for the grating mirror 1, the sacrificial layer 2, and the active region 3. The active part is preferably made of InP-related materials for laser wavelength of 1310 and 1550 nm. This active part is grown from upper layers to lower layers by using an epitaxy growth equipment; layer 11 is grown first and layer 34 is grown last. The low-refractive-index trench 36 is formed before wafer bonding. This procedure is the same as in the fabrication of conventional long-wavelength VCSELs. After the wafer bonding, the substrate for the growth of the active part, preferably InP substrate is removed and the mesas, grating, and contacts are formed.

In this example device, the contacts 83 and 84 for light generation are intra-cavity contacts. However, if relevant or necessary, the p-contact 84 may be formed at the bottom of the substrate 5. In this case, the DBR 4 and the substrate 5 should be doped appropriately. In the grating mirror 1, the positions of the p-doped layer 11 and the n-doped layer 13 can be swapped. Then, the direction of the reverse bias 91 needs to be changed accordingly. In this swapped case, the contact 82 is n-contact and the layer 13 is n-doped material. Thus, the n-contact 82 can be merged with the n-contact 83 if relevant or necessary. For this the sacrificial layer 2 should be n-doped.

In the following in FIGS. 2-4, a number of additional embodiments are described, with different configurations of the bottom mirror 4 and the active region 3. The configuration of the grating mirror 1 and the air gap 21 or sacrificial layer 2 is similar to that described in relation to FIG. 1 above. Features referred to by the same reference numerals as in FIG. 1 are similar to those described in relation to FIG. 1.

Figure 2:
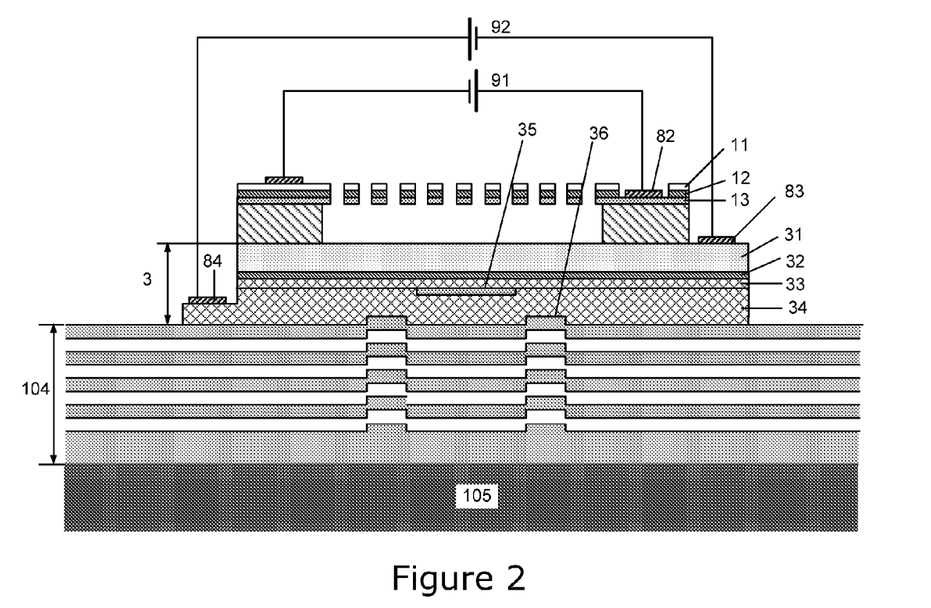
FIG. 2 is the cross-sectional side-view of an example device made without wafer bonding.

In FIG. 2, another example is illustrated. In this embodiment, the bottom DBR 104 is formed by growth or deposition rather than wafer bonding. After forming epitaxial layers 31 to 34 successively by using an epitaxial growth equipment, the trench 36 for optical confinement may or may not be formed. Then, the bottom DBR 104 is formed by using the same epitaxial growth equipment or is deposited by using a dielectric deposition equipment. Then, the carrier substrate 105 is bonded. The active part including the grating mirror, the sacrificial layer, and the active region 103 can be either InP-related materials or GaAs-related materials, depending on the laser wavelength. The DBR 104 can be InP-related materials, GaAs-related materials, and dielectric materials.

Figure 3:
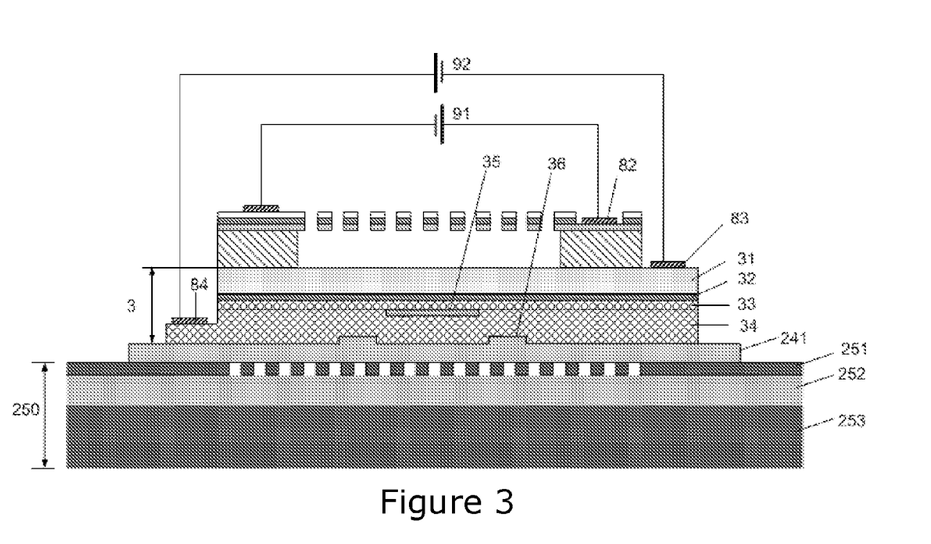
FIG. 3 is the cross-sectional side-view of an example device with a bottom Si grating mirror.

In FIG. 3, another example is illustrated. In this embodiment, the bottom mirror is another grating mirror formed in a Si layer 251 of a silicon-on-insulator (SOI) substrate 250. After forming the active part including layers for the grating mirror and the active region 3, the trench 36 may or may not be formed for the optical mode confinement. Then, $SiO_2$ layer 241 can be deposited on the active part which can be similar to the active parts described in relation to FIG. 1 or 2. Thereafter, the active part with the $SiO_2$ layer 241 deposited can be wafer bonded to the SOI wafer 250 with the Si grating formed.

In the embodiments illustrated in FIGS. 1 to 3, the tunnel junction 35 is preferably located below the active material 32. However, it can also be located above the active region. In this case, the position of the p-doped layer 33 needs to be accordingly changed, which will be straightforward to the people skilled in conventional VCSEL technology.

Figure 4:
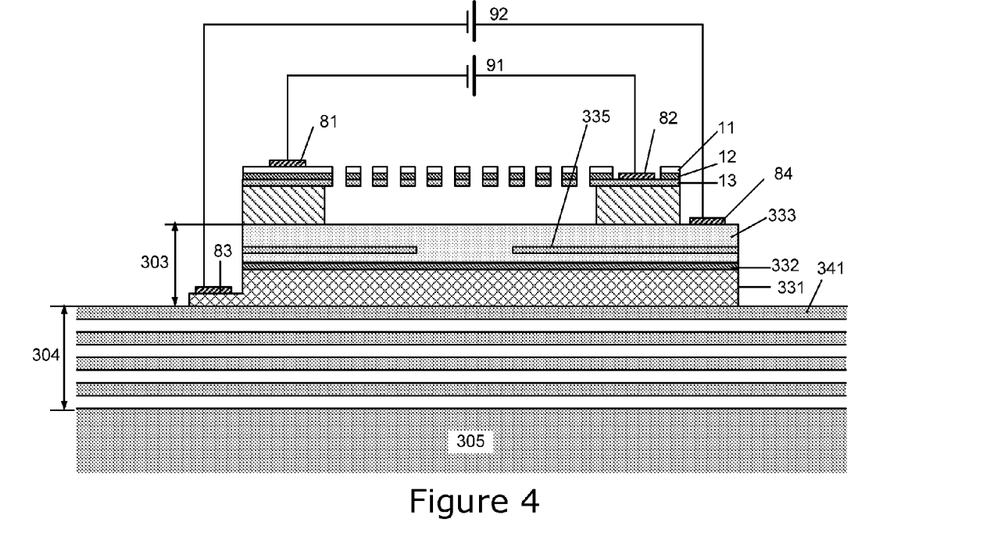
FIG. 4 is the cross-sectional side-view of an example device with an oxide aperture.

In FIG. 4, another example is illustrated. This embodiment is similar to that of FIG. 1 or 2, but all epitaxial layers can be grown using preferably GaAs-related materials without any wafer bonding or re-growth. The growth order is from lower layers and upper layer, i.e., the DBR layers in bottom DBR 304 first and the layers 13, 12, and 11 of the grating mirror last. In this embodiment, the injected current flows through the p-doped layer 333, the active material 332, and the n-doped layer 331. The oxide aperture 335 provides carrier confinement as well as optical mode confinement, and can be formed by wet oxidation. If necessary, the n-contact 83 can be positioned at a different position, e.g., at the bottom of substrate 305. In that case, the bottom DBR 304 and the substrate 305 should be n-doped. If necessary, another oxide aperture can be added below the active material 332. Other variations of this structure known in the literature of VCSELs may be applied if relevant or necessary.

Modulation of the Reflectivity

The refractive index of the electrooptic material 12 embedded in the top grating mirror 1 can be modulated by modulating the strength of electric field applied over the electrooptic material i.e. by modulating the reverse bias voltage 91. The electrooptic effect preferably employed here relies on the quantum confined Stark effect. However, other electrooptic material relying on another effect can be also used if the amount of its refractive index modulation is comparable to that from the quantum confined Stark effect.

Figure 5A:
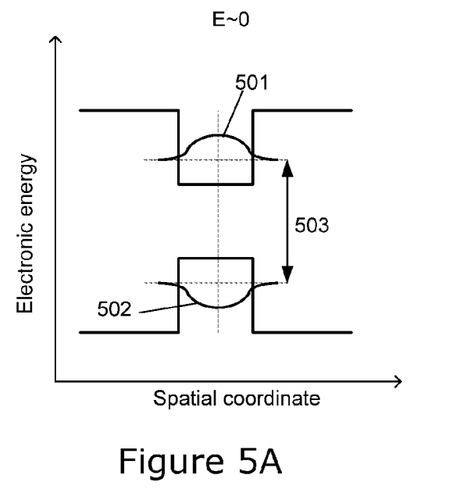
FIG. 5A is the energy band structure of an electrooptic QW with no electric field applied.
Figure 5B:
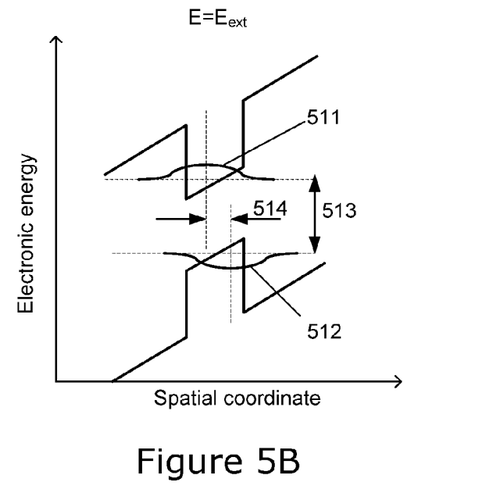
FIG. 5B is the energy band structure of the QW of FIG. 5A with a reverse bias voltage applied.
Figure 5C:
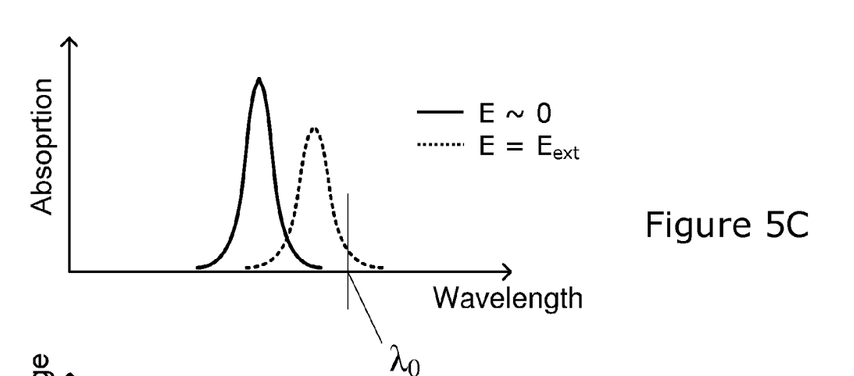
FIG. 5C is the absorption spectra of the QW of FIG. 5A with (dotted line) and without (solid line) a reverse bias voltage. The $\lambda_0$ designates the predetermined lasing wavelength.
Figure 5D:
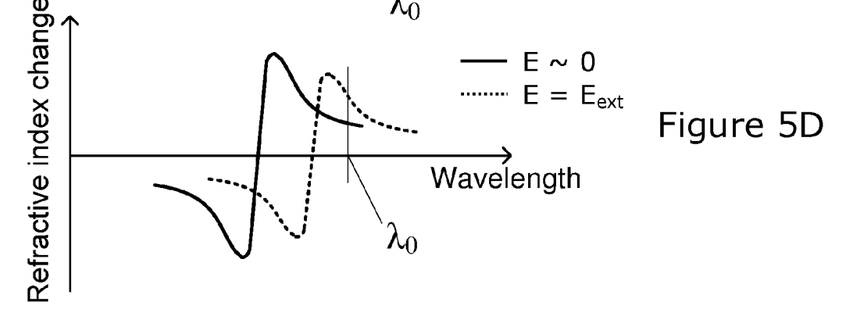
FIG. 5D is the real refractive index spectra of the QW of FIG. 5A with (dotted line) and without (solid line) a reverse bias voltage.

Here, two preferable electrooptic materials are described; QW and type-II heterostructure. A QW structure consists of a thin layer with a smaller energy bandgap and two large-bandgap materials which surrounds the smaller-bandgap layer. As illustrated in FIG. 5A, when there is no (or only a weak) external electric field applied through the QW (E~0), the electrons 501 and holes 502 are confined within the energy wells in the conduction and valence bands, respectively. The electron and hole states are separated by energy difference 503. When a strong external field is applied ($E=E_{ext}$), the energy structure is accordingly inclined as illustrated in FIG. 5B. The energy level difference 513 between the electron state 511 and the hole state 512 becomes smaller than the unbiased energy difference 503; this results in the shift of the peak absorption wavelength toward the longer wavelengths as shown in FIG. 5C, where the solid and dotted curves represents the absorption spectra of the QW without and with an external field, respectively. The peak absorption value of the QW with an external field (dotted curve) is smaller than that without an external field (solid curve). This is attributed to, that an increased spatial separation 514 of the electron and hole distributions resulting from the external field leads to a weaker transition strength between them, which again results in a weaker absorption. This change of absorption spectrum accompanies the change of a real part of the refractive index as shown in FIG. 5D, which is explained by the Kramers-Kronig relation. Thus, the refractive index value of the electrooptic material layer 12 of the grating mirror at a laser emission wavelength $\lambda_0$ can be modulated as a function of the applied field strength.

Figure 6A:
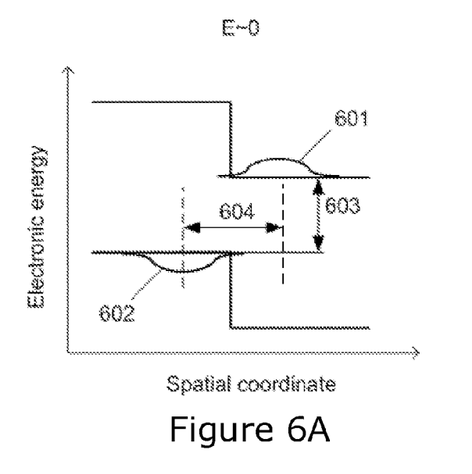
FIG. 6A is the energy band structure of an electrooptic heterojunction structure with no electric field applied.
Figure 6B:
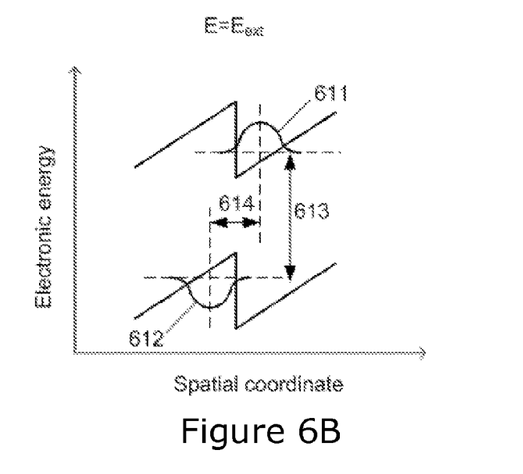
FIG. 6B is the energy band structure of the heterojunction structure of FIG. 6A with a reverse bias voltage applied.
Figure 6C:
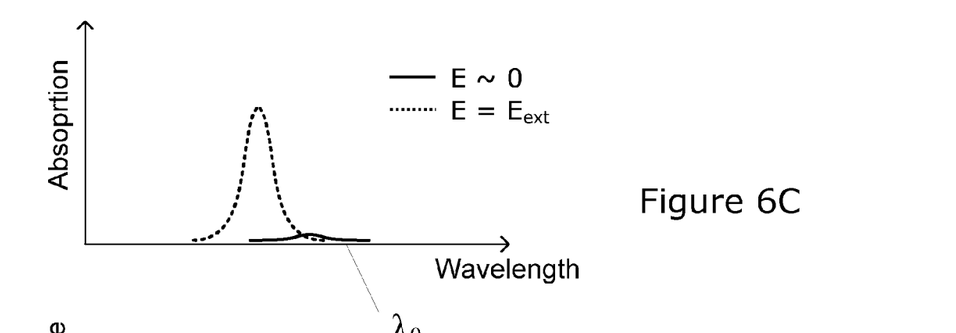
FIG. 6C is the absorption spectra of the heterojunction of FIG. 6A with (dotted line) and without (solid line) a reverse bias voltage. The $\lambda_0$ designates the predetermined lasing wavelength.
Figure 6D:
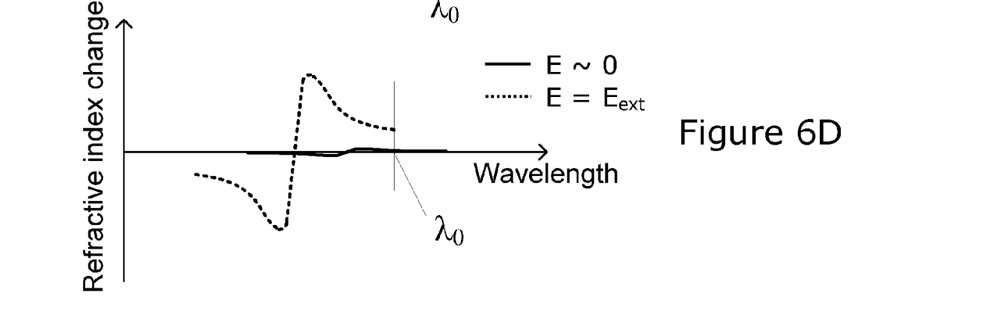
FIG. 6D is the real refractive index spectra of the heterojunction of FIG. 6A with (dotted line) and without (solid line) a reverse bias voltage.

The other electrooptical material, type-II heterostructure, consists of two materials with difference band energies. As illustrated in FIG. 6A, when no (or only a weak) external field is applied (E~0), the electron distribution 601 and the hole distribution 602 have different energy levels with an energy difference 603 and are spatially separated by a distance 604. When an external field is applied ($E=E_{ext}$), the energy band becomes inclined as illustrated in FIG. 6B. Now, the spatial separation 614 becomes smaller than 604 while the energy difference 613 becomes larger than 603. In FIG. 6C, the absorption spectra without an external field (solid curve) and with an external field (dotted curve) are presented. When there is no external field, the absorption is weak due to the large spatial separation 604. When an external field is applied, the absorption spectrum peak shifts toward shorter wavelength due to the increased energy difference 613 and the peak value becomes larger due to the smaller spatial separation 614. As a result, a refractive index modulation of the electrooptic material layer 12 of the grating mirror at the emission wavelength $\lambda_0$ can be obtained as shown in FIG. 6D.

As illustrated by FIGS. 5C-D and 6C-D, the relative shifts in absorption and refractive index are wavelength dependent, and the electrooptic material and the emission wavelength can be selected so that the modulation of the applied external field strength will result, in particular, in the modulation of the refractive index while the absorption is kept substantially low. This condition is for example fulfilled at the wavelength $\lambda_0$ as indicated FIGS. 5C-D and 6C-D.

As described previously, the refractive index change of the electrooptic material layer of the grating mirror alters the resonance condition during the reflection process. Thus, the reflectivity spectrum is also modulated by the applied external field, and thereby also the reflectivity of the grating mirror 1 at the (predetermined) emission wavelength of the laser.

Figure 7:
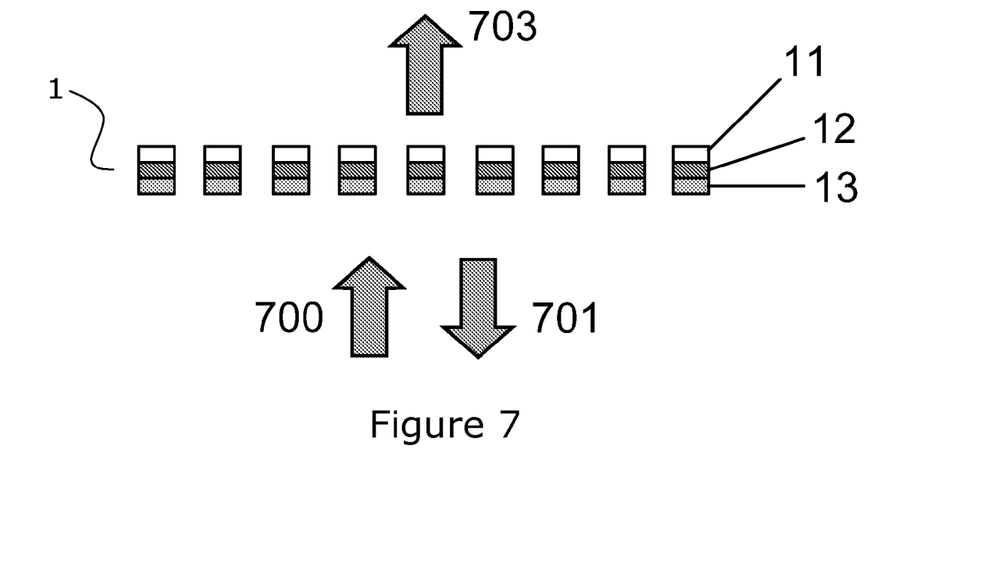
FIG. 7 is a cross-section of an outcoupling grating mirror embedding an electrooptic material according to an embodiment of the invention.

The reverse bias 91 is modulated between a first and a second voltage selected to correspond to a first and a second reflectivity values of the grating mirror 1 at the emission wavelength of the laser. FIG. 7 is a cross-section of an out-coupling grating mirror 1 embedding an electrooptic material 12 according to an embodiment of the invention. Arrows 700 and 701 illustrate light impinging at and being reflected by the grating mirror 1, respectively. Arrow 703 illustrates light being transmitted by the grating mirror 1 and thereby coupled out of and the resonator cavity of the laser, resulting in an emission.

The first voltage is preferably selected so that a reflectivity value at the laser wavelength in the first reflectivity spectrum is in the interval of 99-99.5%, resulting in an emission 703 sufficient for the intended application while providing a reflection 701 large enough to maintain lasing action in the light generating part. The second voltage is preferably selected so that a reflectivity value at the laser wavelength in the second reflectivity spectrum turns off or reduces the emission 703 to provide a binary modulation between the two emission levels, such as a reflectivity value higher than 99.7%. The voltage values can be decided based on the numerical simulation results, i.e., the reflectivity spectrum of a grating mirror as a function of refractive index change of the electrooptic material, and the refractive index change of the electrooptic material as a function of applied voltage.

In a preferred embodiment, the VCL is used as a light source in optical interconnects, where it serves to convert one or more received digitally-modulated electrical signals into a digitally-modulated optical signal. For this purpose, the reverse bias voltage signal will be modulated according to the one or more received digitally-modulated electrical signals.

Optical Confinement

A number of known techniques are available for defining the position of the optical mode in a VCL, also referred to as the transverse mode confinement or optical confinement; several of these are illustrated in connection with FIGS. 1 through 4. As VCLs according to embodiments of the invention have an outcoupling grating mirror that is different from known VCLs, in that it is reflectivity modulated. A general discussion of the optical confinement techniques most suitable for VCLs according to embodiments of the invention is provided in the following.

Typically, the carriers and increased temperature from the current confinement will provide a weak optical confinement also referred to as thermal lensing effect. However, to achieve the desired mode confinement, one or more of the following techniques can be applied.

The mode confinement in conventional optical waveguides is achieved by having a core with a high refractive index surrounded by a cladding with a lower refractive index. This results in a waveguide based on the principle of total internal reflection.

In an optical resonator such as a VCL, the shift of a cavity resonance wavelength corresponds to an effective step in refractive index, $\Delta\lambda/\lambda = \Delta n/n$, due to the wavelength dependence of the dielectric function of the materials, see also G. R. Hadley, "Effective index model for vertical-cavity surface-emitting lasers," Optics Letters, vol. 20, No. 13, p. 1483 (1995). As a result, lateral mode confinement in a VCL can be accomplished by having a central (core) region with a long cavity resonance-wavelength surrounded by an outer (cladding) region with a short cavity resonance-wavelength.

A nonperiodic grating can also be used to define transverse mode. Non-periodic grating can be designed to provide focusing to the reflected beam while keeping high reflectivity, see J. Li, et al., "Strong optical confinement between nonperiodic flat dielectric grating," Physical Review Letters, vol. 106, p. 193901 (2011). The nonperiodic grating scheme can be introduced in the grating mirror embedding the electrooptic material or in the bottom grating mirror without the electrooptic material, e.g., in the bottom Si grating mirror in FIG. 3.

Gain/Current Confinement

Several suitable optical gain media as well as a number of known techniques for defining the position of the optical gain region in the gain medium (typically referred to as current confinement) are available for VCLs. The active region can typically be a multiple QW material layer (a different layer than the electrooptic material layer of the first grating mirror). The current confinement can be provided by a current aperture formed by proton implantation above the QW layer. The implanted region becomes insulating, working as a current aperture and defining the gain region. Alternatively, the optical gain region can be defined by a dielectric aperture, preferably an oxide aperture formed in or near the layer of the active region. The optical gain region can also be defined by a tunnel junction. In a tunnel junction, highly n-doped and p-doped thin layers are put together, and the current flows only through this junction. The various forms of providing an active region and current confinement are considered known to the person skilled in the art of designing VCLs.

Grating Region and Grating Mirror

Figure 8:
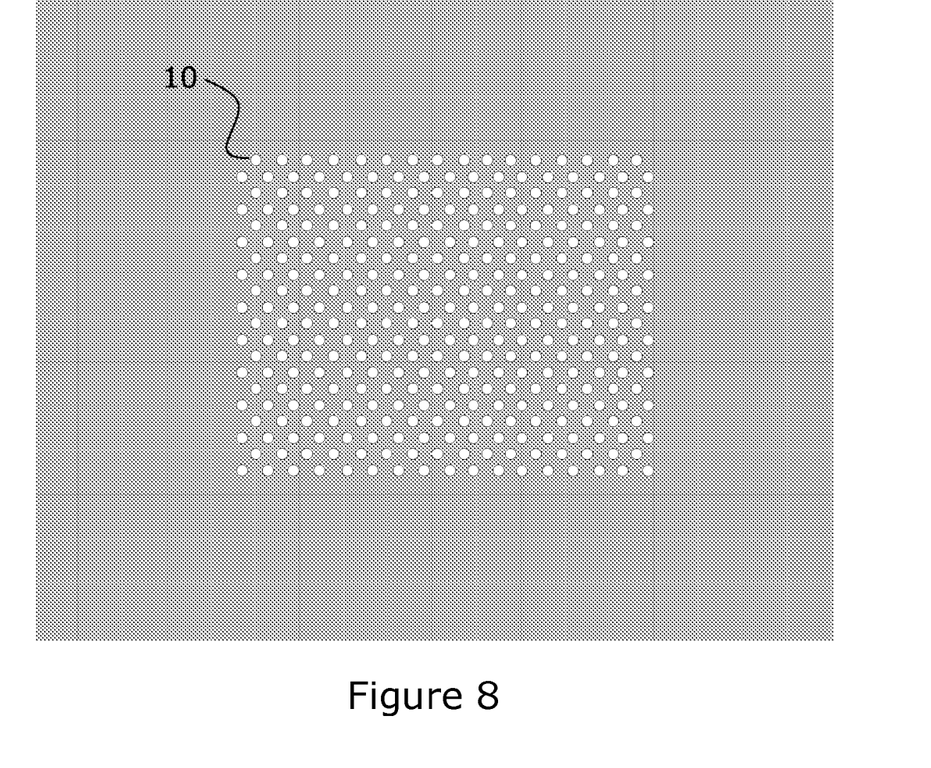
FIG. 8 illustrates a 2D grating structure of a grating mirror according to an embodiment of the invention.

The grating mirror 1 comprises a one-dimensional (1D) or 2D periodic refractive index grating structure 10 formed in the electrooptic material layer 12 and in the p- and n-doped layers 11 and 13. A 1D grating structure 10 is illustrated in FIG. 1B and a 2D grating structure 10 is illustrated in FIG. 8. The grating structure 10 may be formed by removing the material in layers 11, 12, and 13, e.g. by using matured processing techniques to form perforations. The perforations can be left empty (i.e. air filled) or could potentially be filled with a low refractive index material. In an alternative approach, the grating structure 10 is formed by other modification of these layers.

Different 1D and 2D patterns of the periodic refractive index grating structure 10 are shown in FIGS. 1B and 8. In both cases, the pattern are periodic to have photonic bandgap (PBG) modes. For transeverse mode confinement, the grating can be non-periodic. From a design point of view, the important thing is which pattern gives desirable PBG mode dispersion and the resultant mirror characteristics. From a fabrication point of view, the mechanical stability of thin grating layer structure, the fabrication feasibility, and fabrication cost need to be considered to choose the pattern.

The periodicity, thickness, refractive index, air-filling ratio, and lattice structure (e.g., triangular or square lattice) of a grating structure determines its PBG mode dispersion. In the following, preferred possible ranges of the aforementioned design parameters of grating structure are listed. Other ranges and values can be used if they lead to desirable PBG mode dispersion.

The periodicity of grating pattern, either 1D or 2D, ranges from $0.4\lambda$ to $0.8\lambda$ where $\lambda$ is the lasing wavelength of interest. The optical thickness of a grating layer can typically range from $0.5\lambda$ to $1.6\lambda$. The optical thickness of a layer is defined as the physical thickness of the layer multiplied by the refractive index of the layer. The air filling ratio typically ranges from 20% to 85%. The air filling ratio is defined as a fraction of air (or other low index material) area among the area of one grating period.

The origin of the high reflection of the grating mirror is explained in terms of the modes involved. The involved modes are a vertically resonant mode supported by the VCL cavity and laterally-propagating PBG modes of the grating mirror. These PBG modes are Eigenmode of the periodic refractive index grating structure 10. The light in the vertical cavity mode is diffracted when incident to the grating; the part of diffracted light is coupled to the horizontal grating PBG modes; the light in the grating modes is coupled back to the cavity mode. This coupling process may lead to resonance which again leads to a high reflectivity. The number of grating modes involved in the coupling can be one or plural, depending on the design. No coupling loss is expected provided that the whole grating structure is exactly periodic and has no absorption.

APPLICATIONS

The laser comprising a reflectivity modulated outcoupling grating mirror according to the invention is promising in applications where high speed modulation and/or low energy consumption is required. In short-distant optical interconnects applications such as chip- and off-chip level optical interconnects for computers, ultralow energy consumption per sending a bit signal is highly required. There has been no light source with superior energy-consumption-per-bit value as well as feasible fabrication and mW-level output power, reported yet. Thus, the invention has potential to be a breakthrough solution. In conventional optical communication applications, the invention can be competitive over DFB laser and conventional long wavelength VCSELs. Against conventional DFB lasers, the laser according to the invention will consume much less energy. Against conventional long wavelength VCSELs, the laser according to the invention will have higher modulation speed, lower energy consumption, and lower material cost. State-of-the-art VCSEL demonstrates 350 fJ/bit at short wavelength. The laser according to the invention can achieve lower than 100 fJ/bit both at short and long wavelengths. If metamorphic growth of a bottom DBR or a bottom Si grating on a SOI wafer is employed, the wafer cost can be half as small as the conventional long wavelength VCSEL technologies.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

REFERENCES

D. A. B. Miller, "Device requirements for optical interconnects to silicon chips", Proceedings of the IEEE, vol. 97, p. 1166 (2009).

Chang and Colden, "Efficient, high-data-rate, tapered oxide-aperture vertical-cavity surface-emitting lasers", IEEE Journal of Selected Topics in Quantum Electronics, Vol. 15, no. 3, p. 704 (2009).

U.S. Pat. No. 7,593,436

V. A. Shchukin, et al., "Ultrahigh-speed electrooptically-modulated VCSELs: Modelling and experimental results," Proceeding of SPIE, vol. 6889, 68890H, (2008).

U.S. Pat. No. 6,826,223

US 2007/0291808

U.S. Pat. No. 5,408,486

US 2007/0201526

G. R. Hadley, "Effective index model for vertical-cavity surface-emitting lasers," Optics Letters, vol. 20, No. 13, p. 1483 (1995).

J. Li, et al., "Strong optical confinement between nonperiodic flat dielectric grating," Physical Review Letters, vol. 106, p. 193901 (2011).

The invention claimed is:

1. A vertical cavity laser comprising:

a cavity comprising:

a reflector formed on a substrate, the reflector comprising:

an active material configured to generate light in response to an applied current; and a reflecting region;

a reflectivity modulated grating minor comprising:

a p-doped semiconductor layer;

an n-doped semiconductor layer; and an electrooptic material layer arranged between the p-doped semiconductor layer and the n-doped semiconductor layer, wherein the p-doped semiconductor layer, the n-doped semiconductor layer, and the electrooptic material layer form a 1D or 2D grating structure having a plurality of perforations formed therein so that a refractive index changes periodically or non-periodically a direction normal to said oscillation axis; and a gap formed between the first reflector and the reflectivity modulated grating mirror, wherein the cavity is adapted to support light oscillation between the reflecting region of the first reflector and the reflectivity modulated grating mirror along an oscillation axis normal to the substrate; and electric contacts in electrical connection to the p-doped semiconductor layer and to the n-doped semiconductor layer configured to apply electrical bias to the electrooptic material layer wherein the p-doped semiconductor layer and the n-doped semiconductor layer act as electric contacts for the electrooptic layer to change a refractive index of the electrooptic material in response to the applied electrical bias.

2. The vertical cavity laser according to claim 1, wherein the cavity is selected to support lasing in the vertical cavity laser at a predetermined wavelength.

3. The vertical cavity laser according to claim 2, wherein the electrooptic material layer is configured to, upon application of a first and a second reverse bias voltage between the p-doped semiconductor layer and the n-doped semiconductor layer of the reflectivity modulated grating mirror, provide respective first and second reflectivity spectra with different first and second reflectivities at the predetermined wavelength.

4. The vertical cavity laser according to claim 2, wherein the reflector is a grating mirror made in a Si layer of a SOI wafer and having a reflectivity of at least 99.9% at the predetermined wavelength.

5. The vertical cavity laser according to claim 1, wherein the electrooptic material layer is a quantum well semiconductor structure.

6. The vertical cavity laser according to claim 1, wherein the electrooptic material layer comprises a type-II heterojunction.

7. An optical interconnect comprising the vertical cavity laser according to claim 1 configured to provide a light source.

8. A method for modulating the light emission from a vertical cavity laser comprising:
providing a vertical cavity laser having a cavity, the cavity comprising:
a reflector formed on a substrate, the reflector comprising:
an active material configured to generate light in response to an applied current; and
a reflecting region;
a reflectivity modulated grating mirror, the reflectivity modulated grating mirror comprising:
a p-doped semiconductor layer;
an n-doped semiconductor layer;
an electrooptic material layer arranged between the p-doped semiconductor layer and the n-doped semiconductor layer, the p-doped semiconductor layer, the electrooptic material layer and the n-doped semiconductor layer forming a 1D or 2D grating structure having a plurality of perforations formed therein so that a refractive index of the reflectivity modulated grating mirror changes periodically or nonperiodically in a direction normal to an oscillation axis of the vertical cavity laser; and
a gap formed between the reflector and the reflectivity modulated grating mirror,
wherein the cavity is adapted to support light oscillation between the reflecting region of the first reflector and the reflectivity modulated grating mirror along an oscillation axis normal to the substrate;
initiating laser action in the vertical cavity laser at a predetermined wavelength; and
applying a modulated reverse bias voltage between the n-doped semiconductor layer and the p-doped semiconductor layer of the reflectivity modulated grating minor to modulate the refractive index of the electrooptic material layer to modulate a reflectivity spectrum of the grating mirror between at least a first and a second reflectivity, providing different first and second reflectivities at the predetermined wavelength, respectively, wherein lasing in the vertical cavity laser is supported at both the first and the second reflectivity.

9. The method according to claim 8, further comprising maintaining the laser action in the vertical cavity laser continuously during the modulation of the reflectivity spectrum of the reflectivity modulated grating mirror.

10. The method according to claim 8, wherein an electrical bias to an active material of the vertical cavity laser is not modulated during the modulation voltage to the reflectivity modulated grating minor.

11. The method according to claim 8, further comprising receiving one or more digitally-modulated electric signals and performing the modulation of the modulated reverse bias voltage between the p-doped semiconductor layer and the n-doped semiconductor layer according to the digital modulation of the electric signals so as to imply the same modulation onto the reflectivity of the reflectivity modulated grating mirror and thereby to the optical output signal of the vertical cavity laser.

12. The method according to claim 8, wherein the first reflectivity is in the interval of 99-99.5%, and wherein the second reflectivity is at least 99.7%.

13. The method according to claim 8, wherein the electrooptic material layer, the modulated reverse bias voltages, and the predetermined wavelength are selected so that the modulation of the modulated reverse bias voltage predominantly modulates the refractive index in the electrooptic material layer while absorption is substantially small.

14. The method according to claim 8, wherein the electrooptic material layer comprises a quantum well semiconductor structure, type-II heterojunction, or other structure, wherein the refractive index modulation in the electrooptic material layer is a result of the quantum-confined Stark effect (QCSE) or other effect and is thereby wavelength dependent; and wherein the electrooptic material layer, the modulated reverse bias voltages, and the predetermined wavelength are selected so that the modulation of the modulated reverse bias voltage predominantly modulates the refractive index in the electrooptic material layer via QCSE or other effect while an absorption is at least substantially small.

* * * * *

UNITED STATES PATENT AND TRADEMARK OFFICE
CERTIFICATE OF CORRECTION

| | |
|---|---|
| PATENT NO. | : 8,917,752 B2 |
| APPLICATION NO. | : 14/111319 |
| DATED | : December 23, 2014 |
| INVENTOR(S) | : Il-Sug Chung |

Page 1 of 1

It is certified that error appears in the above-identified patent and that said Letters Patent is hereby corrected as shown below:

In the Specification:

At Column 2, Line 58, change "(wavelength 1310nm):" to --(wavelength $\geq$ 1310 nm).--

In the Claims:

In Claim 1, at Column 14, Line 14, change "minor" to --mirror--

In Claim 21, at Column 15, Line 34, change "minor" to --mirror--

In Claim 23, at Column 16, Line 8, change "minor" to --mirror--

Signed and Sealed this
Eleventh Day of August, 2015

Michelle K. Lee
*Director of the United States Patent and Trademark Office*